United States Patent
Becker et al.

(10) Patent No.: US 11,818,859 B2
(45) Date of Patent: Nov. 14, 2023

(54) CARRIER-RAIL BUS ASSEMBLY WITH AUTOMATIC BUS ADDRESSING

(71) Applicant: Bender GmbH & Co. KG, Gruenberg (DE)

(72) Inventors: Matthias Becker, Feldatal (DE); Oliver Schaefer, Gruenberg (DE); Burkhard Macht, Hungen (DE); Michael Prinz-Weinel, Ranstadt (DE)

(73) Assignee: Bender GmbH & Co. KG, Gruenberg (DE)

(*) Notice: Subject to any disclaimer, the term of this patent is extended or adjusted under 35 U.S.C. 154(b) by 89 days.

(21) Appl. No.: 17/516,816

(22) Filed: Nov. 2, 2021

(65) Prior Publication Data

US 2022/0140577 A1    May 5, 2022

(30) Foreign Application Priority Data

Nov. 3, 2020    (DE) ............... 10 2020 128 847.6

(51) Int. Cl.
| | |
|---|---|
| *H05K 7/14* | (2006.01) |
| *H02B 1/052* | (2006.01) |
| *H02B 1/04* | (2006.01) |
| *H02B 1/20* | (2006.01) |

(52) U.S. Cl.
CPC ............ *H05K 7/1478* (2013.01); *H02B 1/04* (2013.01); *H02B 1/052* (2013.01); *H02B 1/205* (2013.01); *H05K 7/1474* (2013.01)

(58) Field of Classification Search
CPC . H02B 1/04; H02B 1/052; H02B 1/20; H02B 1/205; H05K 7/1474; H05K 7/1478
See application file for complete search history.

(56) References Cited

U.S. PATENT DOCUMENTS

| | | | | |
|---|---|---|---|---|
| 5,641,313 A | * | 6/1997 | Hohorst | H01R 9/2658 439/716 |
| 5,939,997 A | * | 8/1999 | Sekine | G06F 13/4086 370/257 |
| 6,175,932 B1 | | 1/2001 | Foote et al. | |

(Continued)

FOREIGN PATENT DOCUMENTS

| | | |
|---|---|---|
| DE | 19838493 C1 | 5/2000 |
| DE | 102010016865 A1 | 11/2011 |

(Continued)

OTHER PUBLICATIONS

E. Dold Soehne KG; In-Rail-Bus; Smart Connection of electronic housings; Germany; www.dold.com.

(Continued)

*Primary Examiner* — Robert J Hoffberg
(74) *Attorney, Agent, or Firm* — Dickinson Wright PLLC; Andrew D. Dorisio

(57) ABSTRACT

A carrier-rail bus assembly including a number of n mechanically contiguous bus-circuit-plate sections electrically connected via bus-circuit paths and installed in a carrier rail, an electronic control unit being configured such that it detects whether an apparatus is inserted in an installation position i, respective installation position i being allotted a bus address, which is assigned to the apparatus inserted on the carrier rail on the respective bus-circuit-plate section in respective installation position i. A related method for assigning a bus address is also disclosed.

9 Claims, 4 Drawing Sheets

(56) References Cited

U.S. PATENT DOCUMENTS

| | | | | |
|---|---|---|---|---|
| 7,139,839 | B2* | 11/2006 | White | H04L 61/5053 |
| | | | | 370/254 |
| 7,370,187 | B2* | 5/2008 | Yardumian | G06F 3/0689 |
| | | | | 711/111 |
| 7,704,079 | B2* | 4/2010 | Weiss | H01R 13/6598 |
| | | | | 439/79 |
| 8,793,417 | B2* | 7/2014 | Bollmeyer | H04L 61/5038 |
| | | | | 710/9 |
| 9,509,108 | B2* | 11/2016 | Kalkreuter | H05K 7/1478 |
| 9,558,864 | B2* | 1/2017 | Kaishian | H01B 5/02 |
| 9,730,353 | B2* | 8/2017 | Bury | H05K 7/1474 |
| 9,795,046 | B2* | 10/2017 | Bury | H05K 7/1477 |
| 10,069,259 | B2* | 9/2018 | Kaishian | H01B 5/02 |
| 10,082,809 | B2* | 9/2018 | Bömoser | H04L 41/0803 |
| 10,409,737 | B2* | 9/2019 | Loewen | H04L 12/40169 |
| 10,707,654 | B2* | 7/2020 | Asanza Maldonado | H02J 13/00034 |
| 2021/0098955 | A1* | 4/2021 | Berg | H01R 25/145 |
| 2022/0006269 | A1* | 1/2022 | Von Der Lieck | H02B 1/205 |

FOREIGN PATENT DOCUMENTS

| | | | | |
|---|---|---|---|---|
| DE | 102015213744 | A1 | 1/2017 | |
| DE | 102019203521 | A1 | 9/2020 | |
| EP | 2053697 | A2 | 4/2009 | |
| EP | 2964005 | A2 | 1/2016 | |
| EP | 2917795 | B1 * | 8/2017 | G05B 19/0421 |

OTHER PUBLICATIONS

Phoenix Contact; DIN rail bus connectors; 2021; https://www.phoenixcontact.com/us/products/2202876.

* cited by examiner

CARRIER-RAIL BUS ASSEMBLY WITH AUTOMATIC BUS ADDRESSING

This application claims priority to German Patent Application No. 10 2020 128 847.6 filed Nov. 3, 2020, the disclosure of which is incorporated herein by reference.

TECHNICAL FIELD

The invention relates to a carrier-rail bus assembly which consists of a number n of mechanically contiguous bus-circuit-plates sections, which are electrically connected via bus-circuit paths, are installed next to each other in a carrier rail in installation positions i ($1 \leq i \leq n$) and each have k contacting elements for being electrically contacted to an apparatus inserted on the carrier rail in the respective installation position i.

BACKGROUND

For fastening electric operating means, such as, for example, residual current devices, relays or circuit breakers in distribution boxes or control cabinets for electric installations, carrier rails are used on which the corresponding casing of the electric operating means (apparatus) can be slid on from the side or inserted and locked in place. To preclude extensive manual wiring of the apparatus, carrier-rail bus systems are available on the market, which electrically connect the individual apparatus to each other for energy supply, for data communication and for signaling, without having to individually wire the apparatus.

For instance, the 16-position carrier-rail bus connector system HBUS by the company PHOENIX CONTACT (www.phoenixcontact.com) is known from the state of the art. The bus connector system HBUS is based on the carrier-rail bus connector elements which are inserted in the carrier rail (DIN C rail) and is clamped thereon. For this purpose, the carrier-rail bus connector is electrically contacted via 16-position plugs and socket boards by being pushed together from the side. The apparatus casings can be snapped onto the carrier rail and thus simultaneously onto the carrier-rail bus connector and be electrically contacted.

Furthermore, the state of the art discloses a bus system by the company E. Dold & Söhne KG by the name "IN-RAIL-BUS", which is a bus system for being integrated in a standard carrier rail (DIN C rail). In this system, a plastic carrier profile having pre-mounted bus circuit plates is inserted in the carrier rail. Parallel circuit paths, which are contacted via contact spring blocks when snapping the carrier rail onto the apparatus casing, are mounted on the bus circuit plate. The carrier profile and the circuit plates can be shortened in length and thus be adapted to the corresponding apparatus casings and installation widths.

A disadvantage of the hitherto known carrier-rail bus systems proves to be that the bus addressing takes place individually in the inserted apparatus and to some extent by manually setting the apparatus itself. Changes or additions at a later stage often disadvantageously require deactivating the electric installation. Exchanging or adding an apparatus during operation is not always possible neither from a mechanical nor an electric viewpoint.

What is more, unambiguously assigning the bus address to the physical location of the apparatus—the installation location in the control unit with the installation position in the carrier rail—is only indirectly possible.

SUMMARY

The object of the invention at hand is therefore to flexibly and reliably design the mechanical and electric installation of carrier-rail apparatus, with particular regard to their integration in a data network.

This object is attained by an electronic control unit being disposed on the bus-circuit-plate section in the first installation position $i=1$ and by a detection circuit path leading to each downstream bus-circuit-path section from the first bus-circuit-plate section in the first installation position $i=1$, the electronic control unit discerning by means of the detection circuit path whether an apparatus i is inserted in the respective installation position i, and the electronic control unit being configured such that the respective installation position i is allotted a bus address, which is assigned to the apparatus inserted on the carrier rail on the respective bus-circuit-plate section in the respective installation position i.

The fundamental idea of the invention at hand is based on transferring the process of assigning a bus address for the respective inserted apparatus from the apparatus to the carrier-rail bus assembly.

For this purpose, the bus-circuit-plate section of the carrier-rail bus assembly, which is fastened in the carrier rail, is provided with an electronic control unit in the first installation position, the electronic control unit being electrically connected to the each downstream bus-circuit-plate section via a detection circuit path guided in the bus-circuit-plate sections. Via a signaling on the corresponding detection circuit path, the electronic control unit immediately detects when an apparatus is inserted on the corresponding bus-circuit-plate section and allots this installation position an individual bus address. This bus address is assigned to the apparatus inserted on the carrier rail on the respective bus-circuit-path section.

By automatically detecting the installation position and the bus address linked to this installation position, the apparatus inserted on the carrier rail in this installation position automatically receives the unambiguous bus address.

Advantageously, separately allotting an address for an inserted apparatus, which under certain circumstances would take place manually, is thus no longer required—the algorithm required for allotting an address, the "intelligence", is transferred from the apparatus to the carrier-rail bus assembly. Immediately once a new apparatus has been inserted or exchanged, an individual address is automatically and accurately allotted to this apparatus.

In contrast to passive connection systems (conventional carrier-rail bus assemblies), which are available on the market and in which the mechanisms for allotting addresses is disposed entirely or mostly in the insertable apparatus, the intelligence for allotting bus addresses is located in carrier-rail bus assembly as intended by the invention. This advantageously leads to a simplified installation of the apparatus with less requirements to these apparatus for participating in the bus system, which in turn proves to be economically advantageous.

By automatically assigning bus addresses, the electronic control unit detects various delay times of the inserted apparatus. The delay times of various inserted apparatus, such as residual current devices (RCDs) or circuit breakers, when switching on the apparatus are taken into consideration by the electronic control unit when allotting addresses.

Moreover, the inserted apparatus are synchronized by means of hardware synchronization signal generated in the electronic control unit.

The electronic control unit is configured in such a manner that the apparatus can be inserted or exchanged during running operation, thus the system does not have to be shut down (a.k.a. hot swapping or hot plugging).

In another embodiment, the carrier-rail bus assembly comprises a bus-circuit-plate end section, which is realized as a connection element and is connected mechanically contiguously to the preceding bus-circuit-plate section and connected electrically to the bus circuit paths and another detection circuit path.

The bus-circuit-plate end section realized as a connection element at one end of the carrier-rail bus assembly in the carrier rail enables the connection to a separate apparatus or operating element, neither of which is disposed in the carrier rail.

In particular, a connection to further carrier-rail bus assemblies according to the invention can be produced by means of the connection element. This allows the installation of a configuration consisting of several carrier-rail bus assemblies connected in series having apparatus via several carrier rails, for example attached one below the other in control cabinets.

Preferably, the connection element is realized as a RJ-45 socket which enables continuing the bus circuit paths and the further detection circuit path via connective lines, such as cable connections.

Furthermore, the carrier-rail bus assembly has a predetermined breaking point between the bus-circuit-plate sections for shortening the carrier-rail bus assembly.

The predetermined breaking point, which runs perpendicular to the longitudinal extension of the carrier-rail bus assembly, advantageously enables adapting the elongated carrier-rail bus assembly to the length of an already available carrier rail.

Furthermore, the contact elements are designed as contacting block. The embodiments of all contact elements or a part of the contact elements as contacting blocks easily enables reliably contacting the inserted apparatus.

Preferably, the bus-circuit-plate sections (in the longitudinal extension of the carrier-rail bus assembly) each have a length of a standard space unit (TE). According to the specifications for electric installations for constructing control cabinets (e.g., according to standard DIN 43880:1988-12), the bus-circuit-plate sections have a width between 17.5 mm and 18.0 mm.

Advantageously, the bus circuit paths of a number of bus circuit paths are designed as energy circuit paths for supplying the inserted apparatus with energy; as data circuit paths for transferring data using the inserted apparatus and as signal circuit paths for controlling the inserted apparatus.

For this reason in particular, the inserted apparatus can be supplied with energy via the energy circuit paths. When several carrier-rail bus assemblies are connected via the connection elements and the connection line, energy can be fed via each carrier-rail bus assembly.

Advantageously, the carrier-rail bus assembly has a self-detecting and reflection-free termination of the carrier-rail bus assembly.

The electronic control unit thus autonomously detects which bus-circuit-plate section forms the termination of the carrier-rail bus assembly and terminates it using a suitable impedance value without reflection (auto termination).

Furthermore, the bus-circuit-plate section is mechanically designed in such a manner that the apparatus to be inserted cannot be wrongly mounted.

The bus-circuit-plate section is mechanically constructed in such a manner that the apparatus to be inserted can be fixed to the cap rail only in the correct installation position with regard to the mechanical allotment to the installation position (in an anti-rotational and anti-slip manner) while ensuring the correct electrical contacting (so as to be protected against reverse polarity).

The object of the invention is further attained by a method for assigning a bus address for an apparatus inserted on a carrier rail, the method comprising the following steps:

Detecting whether an apparatus is inserted in an installation position i by means of the electronic control unit and the detection circuit path, which leads to each further bus-circuit-plate section from the bus-circuit-plate section in first installation position i=1;

allotting the bus address to respective installation position i by means of the electronic control unit; and assigning the bus address to the apparatus, which is inserted on the carrier rail on the respective bus-circuit-plate section in respective installation position i, by means of the electronic control unit.

The embodiment of the previously described carrier-rail bus assembly according to the invention is based on the technical teachings described in the disclosed method. In this respect, the technical effects described above and the advantages of the method resulting therefrom also apply to the method features.

BRIEF DESCRIPTION OF THE DRAWINGS

Further advantageous embodiment features are derived from the following description and the drawings, which describe a preferred embodiment of the invention using examples.

DETAILED DESCRIPTION

Figure 1:
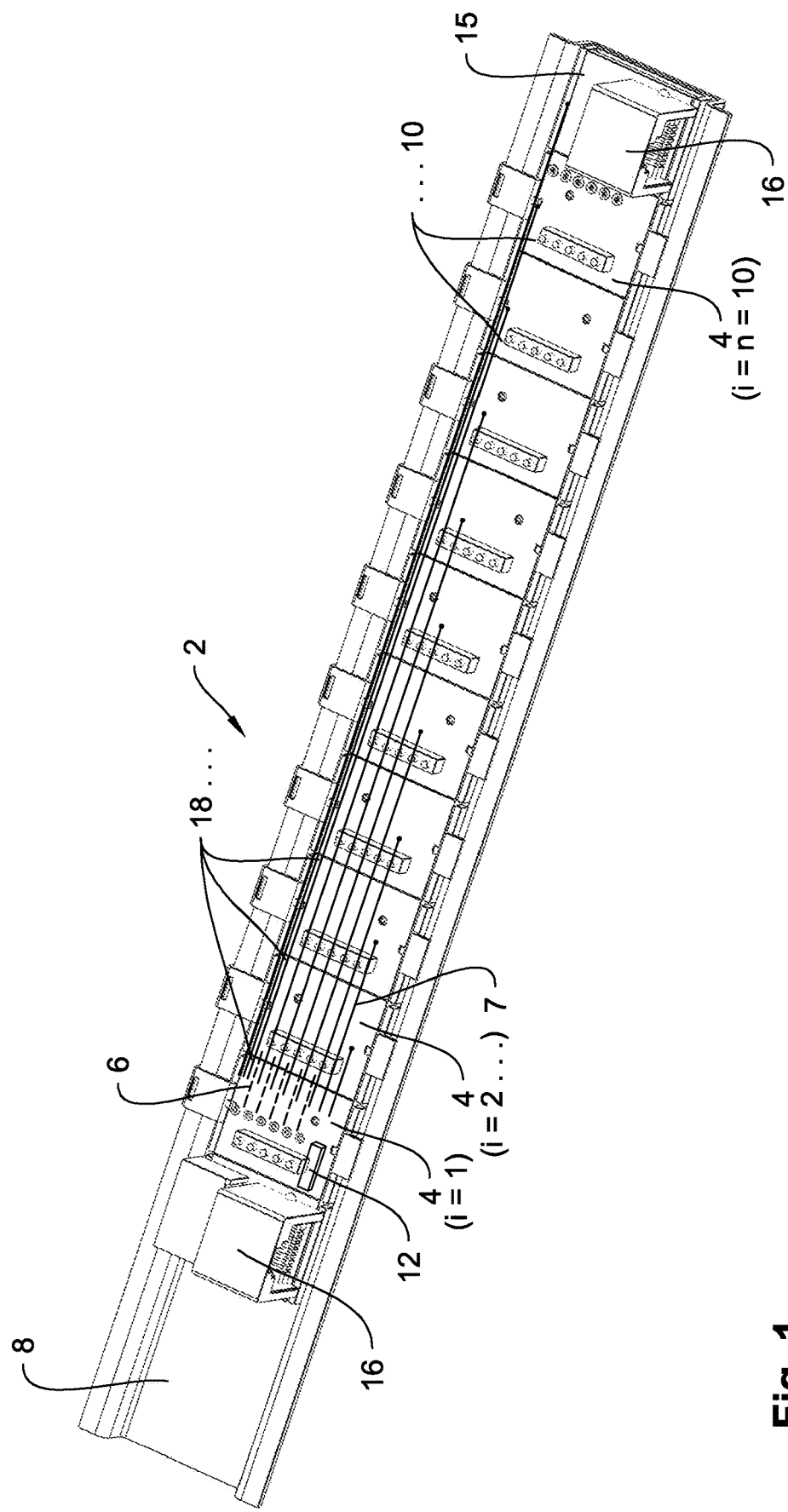
FIG. 1 shows a carrier-rail bus assembly according to the invention installed in a carrier rail.

FIG. 1 shows a perspective view of a carrier-rail bus assembly 2 according to the invention installed in a carrier rail 8.

Carrier-rail bus assembly 2 consists of a number of preferably n=10 bus-circuit-plate sections 4, which are disposed in carrier rail 8.

The mechanical configuration of carrier-rail bus assembly 2 allows only an unambiguous installation position in carrier rail 8, meaning wrongly mounting an apparatus is precluded.

Bus-circuit-path sections 4 are all interconnected with bus circuit paths 6 (in the present example, with m=5; bus circuit paths 6 are only hinted at between bus-circuit-plate sections 4 in the installation positions one and two, and are otherwise covered).

Bus-circuit-plate section 4 located in installation position i=1 comprises an electronic control unit 12, which is preferably realized as a micro-controller.

Starting at bus-circuit-plate section 4 which is occupied by electronic control unit 12 and is located in installation position i=1, a detection circuit path 7 (schematically illustrated) leads to the respective down-stream bus-circuit-plate section 4 and another detection circuit path 7 leads to a bus-circuit-plate end section 15 realized as a connection element 16.

In connection element 16 preferably realized as a RJ-45 socket, the insertion opening is pointed downward (with respect to the installation position in carrier rail 8) in order to prevent possible small parts, such as removed wire insulation, from falling into the socket.

Figure 2:
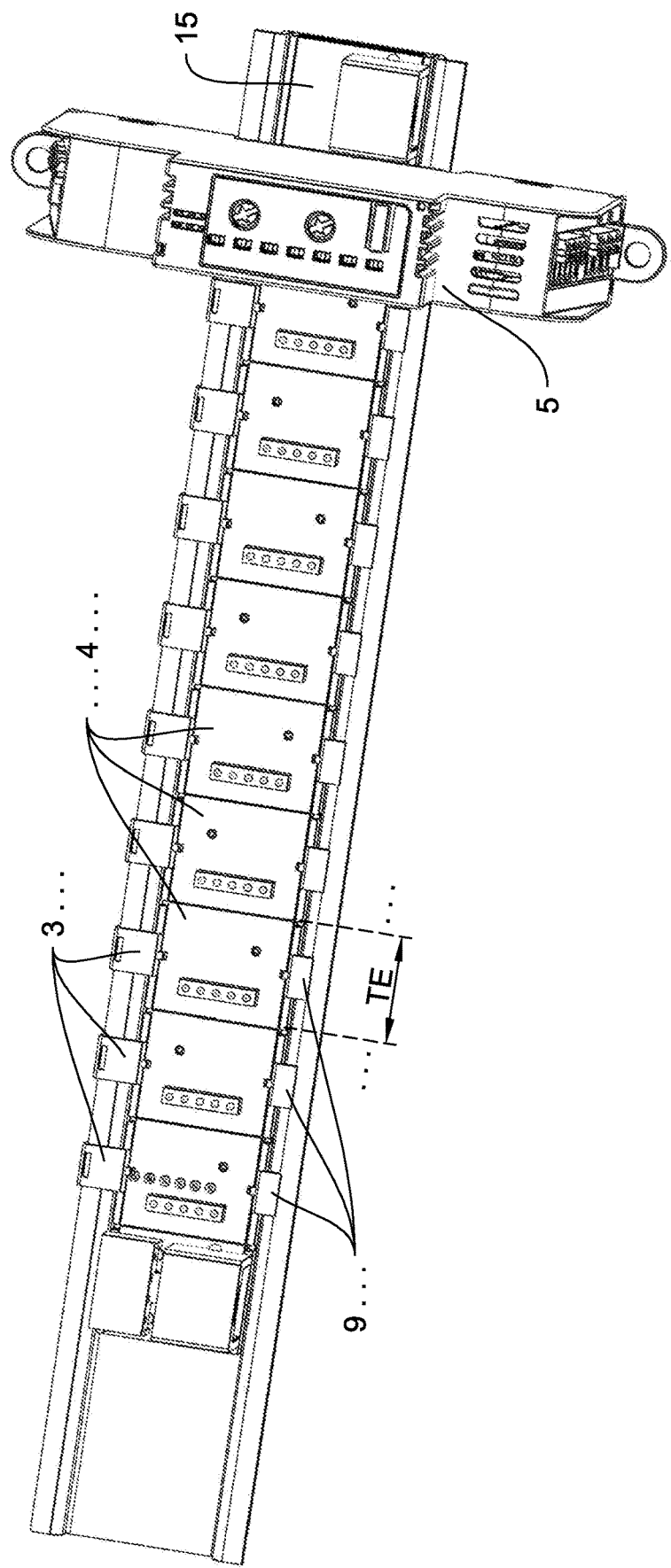
FIG. 2 shows a carrier-rail bus assembly according to the invention having an inserted apparatus installed in a carrier rail.

Bus-circuit-plate sections 4 are each provided with, in the present instance k=5, contacting elements 10 in the form of contacting blocks for contacting respective inserted apparatus 5 (FIG. 2).

On both ends of carrier-rail bus assembly 2, connecting element 16 is disposed in carrier rail 8 while connected in a mechanically contiguous manner to preceding bus-circuit-plate section 4 (in the present example in installation position i=n=10) and electrically connected via five bus circuit paths 6 and further detection circuit path 7.

The carrier-rail bus assembly has a predetermined breaking point 18 between the bus-circuit-plate sections for shortening the carrier-rail bus assembly.

FIG. 2 shows carrier-rail bus assembly 2 according to the invention having apparatus 5 inserted in installation position i=10.

The width of respective bus-circuit-plate section 4 is a standardized space unit TE.

Each bus-circuit-plate section 4 comprises a locking hook 3 on its upper edge (with respect to its installation position in carrier rail 8) and a lip 9 on its lower edge, so that an attachment is only possible in the illustrated vertical direction as bus-circuit-plate section 4 would not find purchase in the opposite vertical direction because of the gravitational force.

Figure 3:
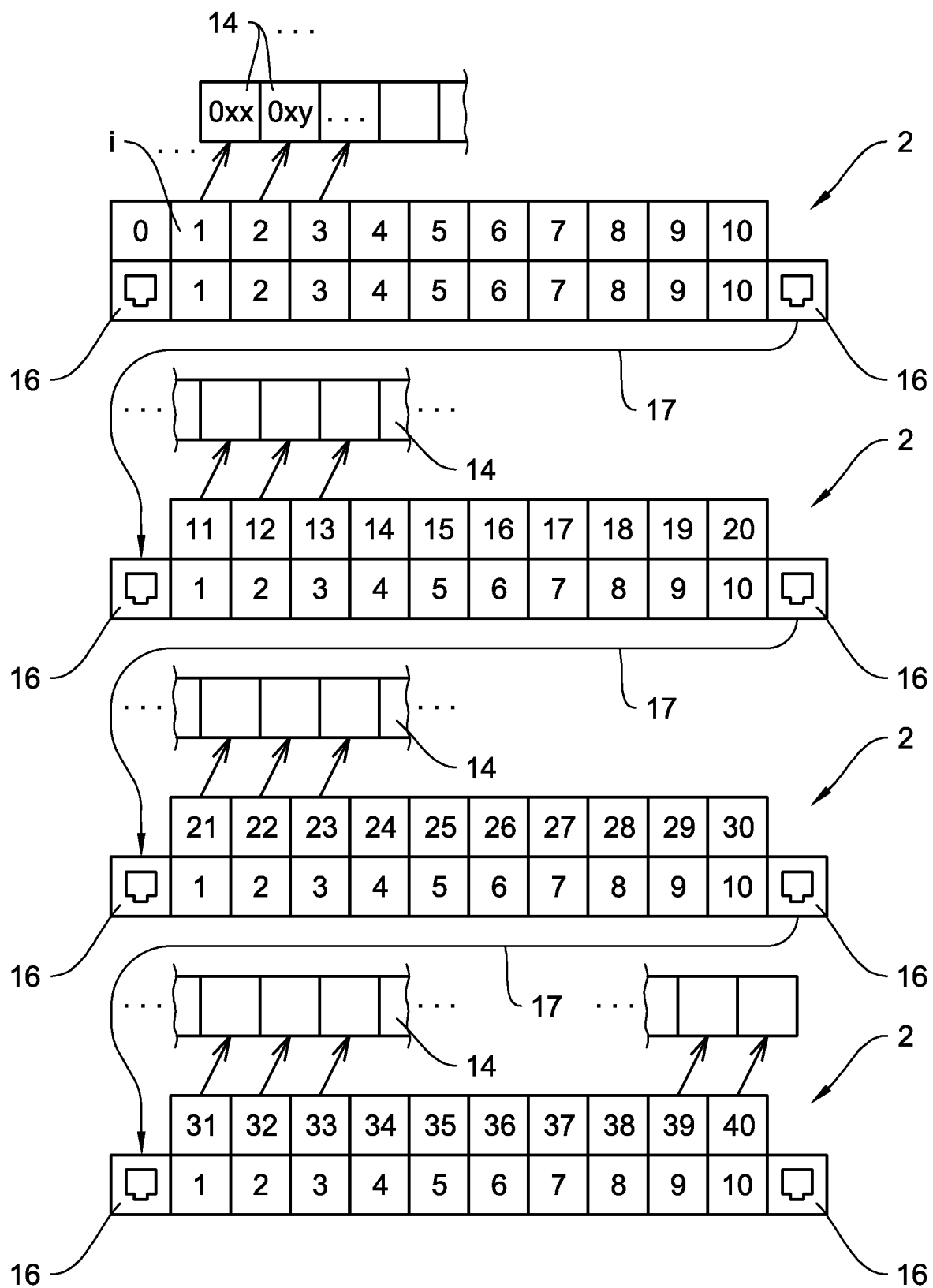
FIG. 3 shows a functional illustration of the bus address allotment.

FIG. 3 shows a functional illustration of the bus address allotment with the assignment of installation position i to bus address 14. In this example, the entire carrier-rail bus assembly extends across several carrier rails 8 (FIG. 1), each having 10 installation positions i, a complete carrier-rail bus assembly 2 being installed in each carrier rail 8.

Individual carrier-rail bus assemblies 2 are connected to each other via a connection element 16 and a connection line 17. In this configuration, installation position i with respect to the entire carrier-rail bus assembly is numbered serially (absolute installation position). The position referring to respective carrier rail 8 is occupied for each carrier rail 8 with a new numbering.

Each absolute installation position i is allotted an individual bus address 14, which is automatically assigned to apparatus 5 (FIG. 2) inserted on carrier rail 8 in respective (absolute) installation position i and in the thus corresponding position.

Figure 4:
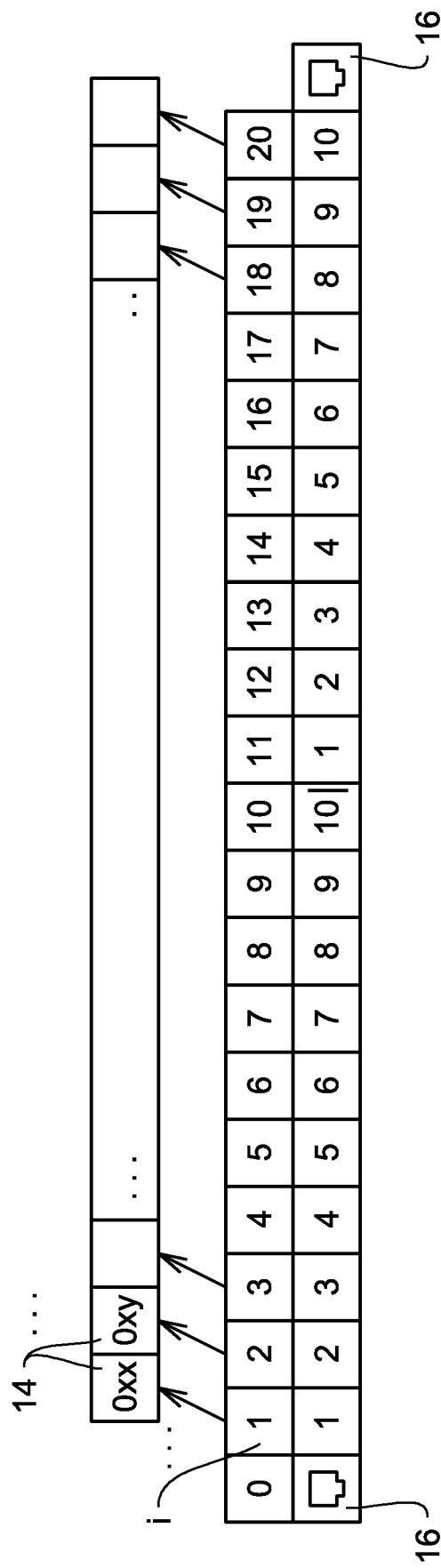
FIG. 4 shows a functional illustration of the bus address allotment in a long carrier rail.

FIG. 4 shows a functional view of the bus address allotment on a long carrier rail.

In this embodiment, two carrier-rail bus assemblies 2 are directly realized as a contiguous carrier-rail bus assembly on a long carrier rail 8 (FIG. 1). Both carrier-rail bus assemblies 2, which are each complete, are connected mechanically and electrically to each other and connecting line 17 not via connecting element 16, but directly like bus-circuit-plate sections 4 (FIG. 1).

The invention claimed is:

1. A carrier-rail bus assembly comprising a number of n mechanically contiguous bus-circuit-plate sections (4) electrically connected via bus circuit paths (6), wherein the bus-circuit-plate sections (4) are installed next to each other in installation positions i ($1 \leq i \leq n$) and each have k contacting elements (10) for being electrically contacted with an apparatus (5) inserted on a carrier rail (8) in a respective installation position of the installation positions i, characterized in that
the carrier-rail bus assembly further comprises a plurality of distinct detection circuit paths (7), and
an electronic control unit (12) is disposed on a first bus-circuit-plate section in a first installation position i=1 of the installation positions i and each of the distinct detection circuit paths (7) leads from the first bus-circuit-plate section in the first installation position i=1 to a respective downstream bus-circuit-plate section of the bus-circuit-plate sections (4) such that the first bus-circuit-plate section in the first installation position i=1 is connected to each of the respective downstream bus-circuit-plate sections by a different one of the plurality of distinct detection circuit paths (7), the electronic control unit (12) detecting, by means of a respective one of the distinct detection circuit paths (7), whether the apparatus (5) is inserted in the respective installation position of the installation positions i in question, and the electronic control unit being configured such that the respective installation position of the installation positions i is allotted to a bus address (14), which is assigned to the apparatus (5) inserted on the carrier rail (8) on a respective bus-circuit-plate section of the bus-circuit-plate sections (4) in the respective installation position of the installment positions i.

2. The carrier-rail bus assembly according to claim 1, characterized by
a bus-circuit-plate end section (15), which is realized as a connection element (16) and is electrically connected to the bus circuit paths (6) and another distinct detection circuit path (7) so as to be mechanically contiguous with a preceding bus-circuit-plate section of the bus-circuit-plate sections (4).

3. The carrier-rail bus assembly according to claim 1, characterized by
a predetermined breaking point (18) between adjacent ones of the bus-circuit-plate sections (4) for shortening the carrier-rail bus assembly (2).

4. The carrier-rail bus assembly according to claim 1, characterized in that
the contacting elements (10) are realized as contacting block.

5. The carrier-rail bus assembly according to claim 1, characterized in that
each of the bus-circuit-plate sections (4) is as long as a standardized space unit (TE).

6. The carrier-rail bus assembly according to claim 1, characterized in that
respective numbers of the bus circuit paths (6) are each realized as energy circuit paths for supplying energy to the inserted apparatus, as data circuit paths for transferring data using the inserted apparatus, and as signal circuit paths for controlling the inserted apparatus (5).

7. The carrier-rail bus assembly according to claim 1, characterized by
a self-detecting and reflection-free termination of the carrier-rail bus assembly (2).

8. The carrier-rail bus assembly according to claim 1, characterized in that
each of the bus-circuit-plate sections (4) is mechanically designed in such a manner that the apparatus (5) to be inserted cannot be wrongly mounted.

9. A method for assigning a bus address for an apparatus (5), which is inserted on a carrier rail (8), by means of a carrier-rail bus assembly according to claim 1, the method comprising the following steps:
detecting whether the apparatus (5) is inserted in the respective installation position of the installation positions i by means of the electronic control unit (12) and the respective one of the distinct detection circuit paths (7), which leads to each further bus-circuit-plate section of the bus-circuit-plate sections (4) from the first bus-circuit-plate section (4) in the first installation position i=1;

allotting the bus address (14) to the respective installation position of the installation positions i by means of the electronic control unit (12); and assigning the bus address (14) to the apparatus (5), which is inserted on the carrier rail on the respective bus-circuit-plate section of the bus-circuit-plate sections (4) in the respective installation position of the installation positions i, by means of the electronic control unit (12).

\* \* \* \* \*